United States Patent
Heo et al.

(10) Patent No.: US 8,492,058 B2
(45) Date of Patent: Jul. 23, 2013

(54) PHOTOLITHOGRAPHY METHOD INCLUDING TECHNIQUE OF DETERMINING DISTRIBUTION OF ENERGY OF EXPOSURE LIGHT PASSING THROUGH SLIT OF EXPOSURE APPARATUS

(71) Applicants: Jin-Seok Heo, Suwon-si (KR); Seok-Hwan Oh, Seoul (KR); Jeong-Ho Yeo, Suwon-si (KR)

(72) Inventors: Jin-Seok Heo, Suwon-si (KR); Seok-Hwan Oh, Seoul (KR); Jeong-Ho Yeo, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/710,643

(22) Filed: Dec. 11, 2012

(65) Prior Publication Data

US 2013/0101928 A1  Apr. 25, 2013

Related U.S. Application Data

(63) Continuation of application No. 13/402,902, filed on Feb. 23, 2012, now Pat. No. 8,338,063.

(30) Foreign Application Priority Data

Mar. 25, 2011 (KR) ........................ 10-2011-0026712

(51) Int. Cl.
*G03F 9/00* (2006.01)

(52) U.S. Cl.
USPC .............................. 430/30; 430/394; 382/145

(58) Field of Classification Search
USPC ..................................... 430/30, 394; 382/145
See application file for complete search history.

(56) References Cited

U.S. PATENT DOCUMENTS

| 5,393,624 A | 2/1995 | Ushijima |
| 2009/0170222 A1 | 7/2009 | Reid et al. |

FOREIGN PATENT DOCUMENTS

| KR | 0139309 | 2/1998 |
| KR | 0139814 | 3/1998 |
| KR | 1020060045401 A | 5/2006 |

*Primary Examiner* — Christopher Young
(74) *Attorney, Agent, or Firm* — Volentine & Whitt, PLLC

(57) ABSTRACT

The energy distribution of exposure light directed passing through the slit of an exposure apparatus is determined. A photoresist layer on a substrate is exposed over a plurality of shots while changing the intensity of the exposure light for each shot. Then the photoresist layer is developed to form a sample photoresist layer. An image of the developed sample photoresist layer is analyzed for color intensity. Values of the color intensity across a selected one of the shots are correlated with values of the intensity of the exposure light to produce an energy distribution of the exposure light along the length of the slit. The energy distribution is used to change the slit so that a more desirable energy distribution may be realized when the slit is used in a process of manufacturing a semiconductor device.

20 Claims, 11 Drawing Sheets

PHOTOLITHOGRAPHY METHOD INCLUDING TECHNIQUE OF DETERMINING DISTRIBUTION OF ENERGY OF EXPOSURE LIGHT PASSING THROUGH SLIT OF EXPOSURE APPARATUS

PRIORITY STATEMENT

This application is a Continuation application of application Ser. No. 13/402,902, filed Feb. 23, 2012 which claims priority under 35 USC §119 to Korean Patent Application No. 10-2011-0026712, filed on Mar. 25, 2011 in the Korean Intellectual Property Office (KIPO), the contents of which are hereby incorporated by reference in their entirety.

BACKGROUND

The inventive concept relates to photolithography. More particularly, the inventive concept relates to a method of measuring the distribution of energy in exposure light emitted by a scanner of photolithographic equipment.

Photolithography is a process used to transcribe a pattern, such as a circuit pattern or the like, onto a substrate. Photolithography includes an exposure process in which a layer of resist on a substrate is exposed to light directed through a reticle such that the resist is exposed to an image corresponding to that of a pattern of the reticle. The resist is then developed to remove the exposed portion thereof (in the case of a positive resist) or non-exposed portion thereof (in the case of a negative resist), thereby forming a resist pattern. Then, a layer of material lying under the resist pattern is etched using the resist pattern as a mask. As a result, a pattern corresponding to the pattern of the reticle is transcribed onto the substrate.

A scanner-type of exposure apparatus of a photolithography system employs an exposure slit through which the exposure light passes during exposure process, and a set-up in which the reticle and a stage supporting the substrate are moved relative to each other so that the resist is scanned by the exposure light. In general, both the dose and intensity of the energy of the exposure light passing through the slit must be uniform if the exposure process is to be carried out effectively.

Therefore, the dose and intensity of the exposure light must be controlled to be uniform during the exposure process. To this end, information regarding the exposure light or feedback is necessary. In this respect, it becomes necessary to accurately measure the "energy distribution" of the exposure light passing through the slit.

A sensor integrated with the scanner-type of exposure apparatus may be used to measure the energy distribution of the exposure light. Such a sensor, however, takes dozens of minutes to several hours to measure the energy distribution of light. The exposure system is not operated during this time. That is, there is a great deal of down time in an exposure process, performed by a scanner-type of exposure apparatus, in which the exposure light is controlled based on measurements obtained using a sensor.

SUMMARY

There is provided a method for use in photolithography performed by an exposure apparatus having a slit, in which the distribution of energy levels of the exposure light along the length of the slit is determined empirically.

According to an aspect of the inventive concept, a photoresist layer on a substrate is exposed over each of a plurality of shots sequentially by irradiating the photoresist layer to exposure light directed through the slit of the exposure apparatus. In this process, the intensity of the exposure light irradiating is made to be different for each shot. The exposed photoresist layer is then developed to form a sample photoresist layer. Next, an image of the sample photoresist layer is analyzed to determine the intensity of a color of each shot. One of the shots on the developed sample photoresist layer is selected from a series of sequentially exposed ones of the shots over which the intensity of the colors changes from shot to shot. Then the intensity of the color of each pixel within an image of the selected shot is determined. The pixels are arrayed in rows each extending in a direction corresponding to a lengthwise direction of the slit, and in columns Values of the intensities of the color of the pixels for each column of the pixels within the selected shot are averaged, and the average value for each column is assigned to a position that the column occupies along the rows of the pixels. For each assigned average value, the color intensity value is correlated with a value of the intensity of the exposure light. This correlation yields a series of values of the intensity of the exposure light representative of the distribution of energy levels of the exposure light along the length of the slit during the process of exposing the layer of photoresist. Then the slit of the exposure apparatus is changed based on the so determined distribution of energy levels of the exposure light.

According to another aspect of the inventive concept, a photoresist layer on a substrate is irradiated with exposure light directed through the slit of a scanner. In this process, the photoresist layer is exposed over each of a plurality of shots sequentially, each shot is scanned with the exposure light in a direction corresponding to the lengthwise direction of the slit, and the intensity of the exposure light is varied from shot to shot. Next, the exposed photoresist layer is developed to form a sample photoresist layer. One of the shots on the developed sample photoresist layer is selected, and the intensity of a color of each pixel within an image of the selected shot is determined. The array of pixels comprises at least one row of pixels extending in a direction corresponding to the lengthwise direction of the slit. Based on the intensity of the color of each pixel, values of intensity of the color are correlated with values of the intensity of the exposure light. This yields a series of values of the intensity of the exposure light representative of the distribution of energy levels of the exposure light along the length of the slit during the process of scanning each of the shots with the exposure light. The slit of the exposure apparatus is then changed based on the so determined distribution of energy levels of the exposure light.

According to yet another aspect of the inventive concept, a method for use in photolithography comprises deriving an empirical relationship by which the energy distribution of exposure light through a slit of an exposure apparatus can be obtained. A photoresist layer on a sample substrate is exposed over each of a plurality of sample shots sequentially. In this process, the photoresist layer on the sample substrate is irradiated with exposure light directed through the slit of the exposure apparatus, and the intensity of the exposure light irradiating each sample shot is different. Then the exposed photoresist layer is developed to form a sample substrate photoresist layer, and an image of the developed sample substrate photoresist layer is analyzed to determine the intensity of a color of each sample shot. The thickness of each sample shot is measure, and based on the measured thicknesses of the sample shots, the intensity of the color of the sample shots is correlated with the intensity of the exposure light that was used to irradiate the selected ones of the sample shots.

BRIEF DESCRIPTION OF THE DRAWINGS

The inventive concept will be more clearly understood from the following detailed description of preferred embodiments made in conjunction with the accompanying drawings.

DETAILED DESCRIPTION OF THE PREFERRED EMBODIMENTS

Various embodiments and examples of embodiments of the inventive concept will be described more fully hereinafter with reference to the accompanying drawings.

Furthermore, the terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes. Also, the term "intensity" as used in connection with exposure light generally refers to the irradiance or energy level of the exposure light as is clear from the units assigned to measurement of light intensity provided in the specification and drawings.

Examples of a technique of quantifying the energy distribution of exposure light in a scanner-type of exposure apparatus (referred to simply as a "scanner" hereinafter), and a photolithography method making use of such a technique, will now be described in detail with reference to the attached drawings.

Figure 1:
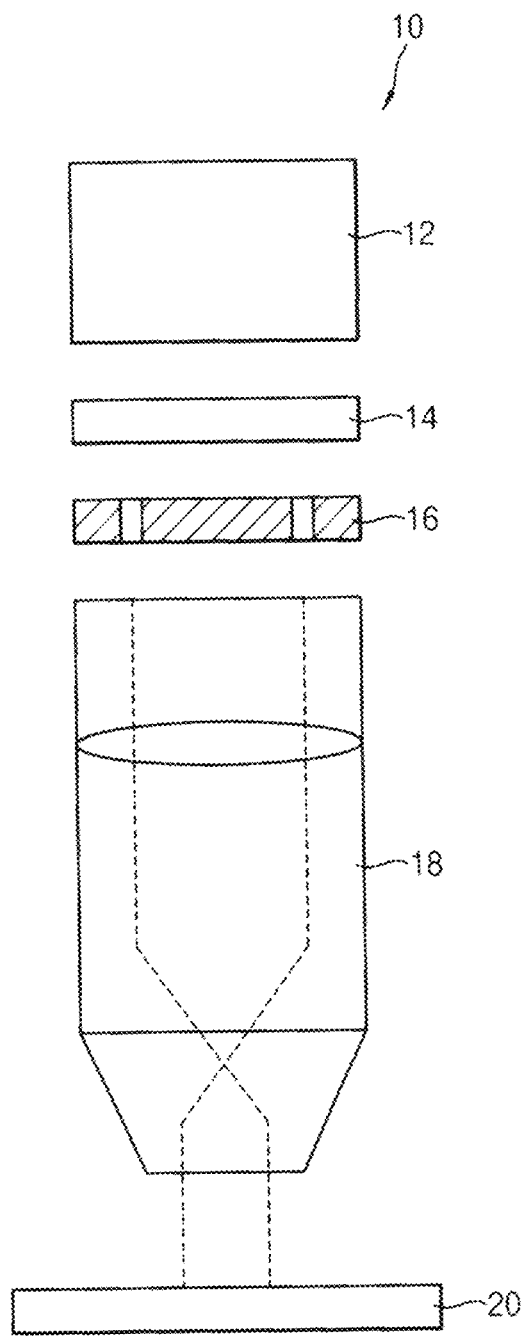
FIG. 1 is a schematic cross-sectional view of a scanner-type of exposure apparatus.

Referring first to FIG. 1, the scanner 10 includes a condenser lens 12 for condensing light emitted from a light source (not illustrated), a reticle 16 having pattern corresponding to a circuit pattern to be formed on a semiconductor substrate, a slit 14 for confining the light condensed by the condenser lens 12 to a limited (desired) region of the reticle 14, a projection lens system 18 for reducing the image of the light transmitted through the reticle 16 and projecting the reduced image onto a substrate, and a wafer stage 20 provided under the projection lens system 18 for supporting the substrate.

The size of the slit 14 may be about 8 mm×26 mm. However, the slit may be adjustable as will be described in more detail later on. The projection lens system 18 has a focal length of about 26 mm. Using these sizes as an example, the largest area that is exposed during a scan, in which the reticle 16 and the substrate are moved at a constant speed relative to each other, is about 26 mm×33 mm.

A method of exposing a substrate 50, using the scanner 10, will now be described with reference to FIGS. 1 and 2.

The substrate 50 is divided into a plurality of regions 52 referred to as "shots" and the shots 52 of the substrate 50 are sequentially exposed by the exposure light. In each shot 52, however, an area A (exposure field) is scanned by the exposure light and after each scan, the substrate 50 is moved relative to the exposure system 10 so that the exposure field A is moved along the direction designated by the arrows in FIG. 2.

Figure 2:
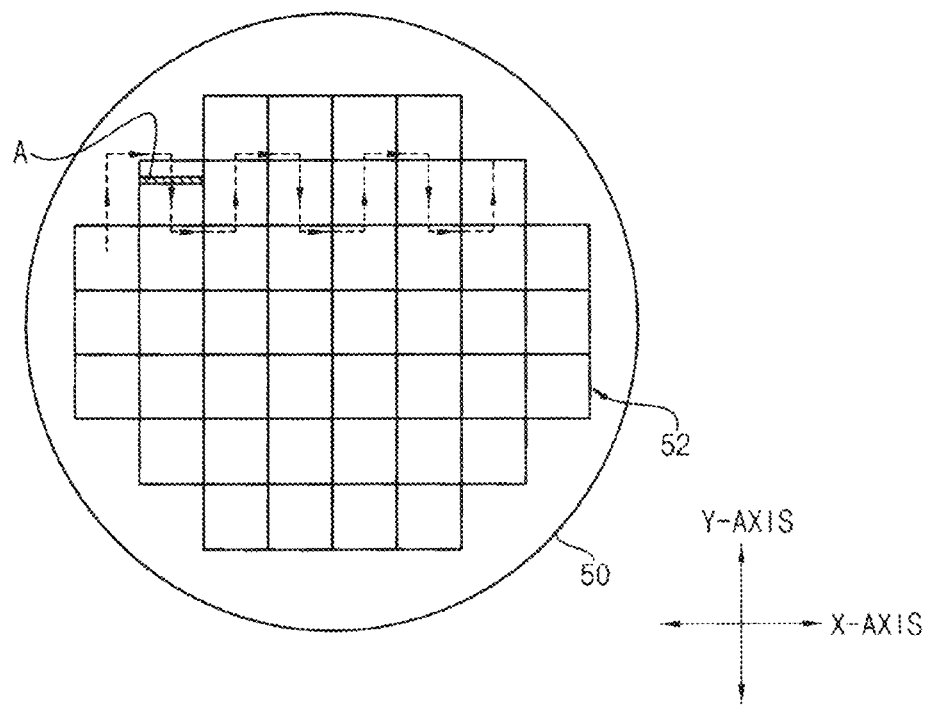
FIG. 2 is a plan view of a substrate (wafer) and illustrates a method of exposing shots in the substrate using the scanner-type of exposure apparatus illustrated in FIG. 1.

More specifically, in the illustrated process, the length of the exposure field A has the same dimension as each shot 52 in a given direction (the direction of the X-axis in FIG. 2). After an exposure field A in a shot is exposed, the substrate 50 is moved relative to the exposure system 10 in the width-wise direction of the exposure field A, i.e., along the direction of the Y-axis, by an amount equal to the width of the exposure field A, and the exposure process is then performed again with respect to the new exposure field A This process is repeated until the entire shot region 52 is exposed. After an entire shot 52 is exposed, the substrate 50 may be moved in the direction of the X-axis relative to the exposure system 10 to locate the exposure field in the adjacent shot 52, and then the adjacent shot region is exposed as described above by moving the exposure field A along the direction of the Y-axis. Thus, the substrate 50 is moved in one direction along the Y-axis while a first shot 52 is exposed, and the substrate 50 may be moved in the other direction along the Y-axis (i.e., in the opposite direction) while the next shot 52 is exposed.

In this way, a resist layer formed over an entire region of the substrate 50 constituted by the shots 52 may be exposed. Then, as mentioned above, the resist layer is developed to thereby form a resist pattern.

In this case, the exposure light passes through the slit 14 of the exposure system 10 to expose the layer of resist over each exposure field A. The energy distribution of the exposure light along the slit 14, that is, at each location along the length of the slit 14, must be uniform if the resist pattern to be formed by the exposure process is to have uniform characteristics.

Figure 3A:
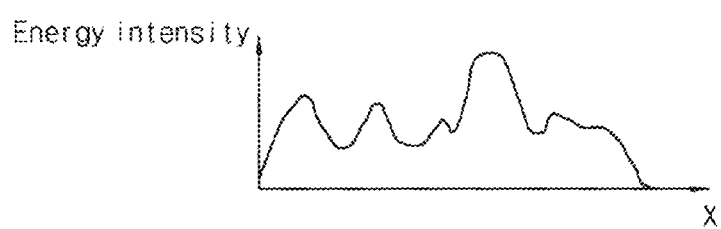
FIGS. 3A and 3B are graphs illustrating actual and desired energy distributions of exposure light passing through a slit of the scanner-type of exposure apparatus illustrated in FIG. 1.
Figure 3B:
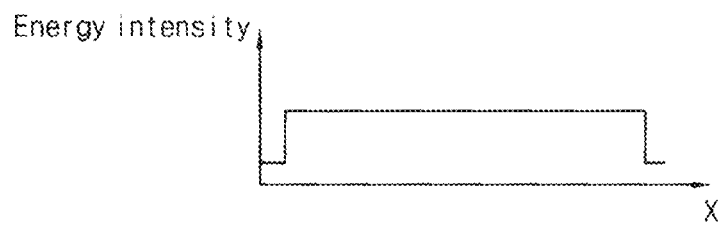

FIG. 3A show a non-uniform energy distribution (in this case, intensity) of exposure light along the slit 14. On the other hand, FIG. 3B shows a uniform energy distribution along the slit 14. In the case in which the scanner 10 is producing exposure light having a non-uniform energy distribution as illustrated in FIG. 3A, the scanner 10 must be adjusted or controlled such that the exposure light has a uniform energy distribution as illustrated in FIG. 3B. To this end, the distribution of the intensity of the exposure light passing through the slit 14 must be measured along the length of the slit 14.

According to an aspect of the inventive concept, relationships between the intensity of the exposure light, the thickness of the resist pattern (of the layer of photoresist after the developing process), and color characteristics of an image of the developed photoresist layer, are determined and then are subsequently used to determine or "measure" the distribution of the intensity of the exposure light passing through the slit 14. These relationships as conceived by the present inventors will first be described in more detail.

When a layer of a positive resist (referred to simply as a "photoresist layer" hereinafter) is exposed using a scanner-type of exposure apparatus, the exposed portion of the photoresist layer undergoes a cross-linking which makes the exposed portion highly soluble in a developing solution. Thus, the exposed portion of the photoresist layer may be selectively removed by performing a developing process in which the exposed photoresist layer is wetted by the developing solution. In this respect, the degree of cross-linking depends on the dosage (level of energy) of the exposure light. Furthermore, when a layer of photoresist is exposed, the thickness of a layer of photoresist changes, and the change in thickness depends on the dosage of the energy of the exposure light.

More specifically, cross-linking does not occur when the intensity or energy of the exposure light has a relatively low value. In this case, the thickness of the photoresist layer is hardly affected by the developing process. On the other hand, cross-linking occurs throughout the thickness of the layer of photoresist when the energy or intensity of the exposure light has a certain relatively high value. In this case, the developing process will remove nearly all of the exposed photoresist, i.e., the thickness of the photoresist layer after the developing process is nearly zero. Furthermore, the thickness of the exposed photoresist layer remaining after the developing process is basically inversely proportional to the intensity of the exposure light when the value of the intensity is intermediate the aforementioned relatively low and high values.

Still further, the specific color and gradation in the color (which may be referred to hereinafter simply as the intensity of the color) of the photoresist layer is also dependent on the thickness of the photoresist layer. In particular, photoresist layers of the same composition but different thicknesses may exhibit not only reds, greens, blues but different intensities in the reds, greens, blues depending on the thicknesses of the layers. Accordingly, the color and gradation in the color of light reflecting from a layer of photoresist varies in accordance with variations in the thickness of the layer.

Figure 5:
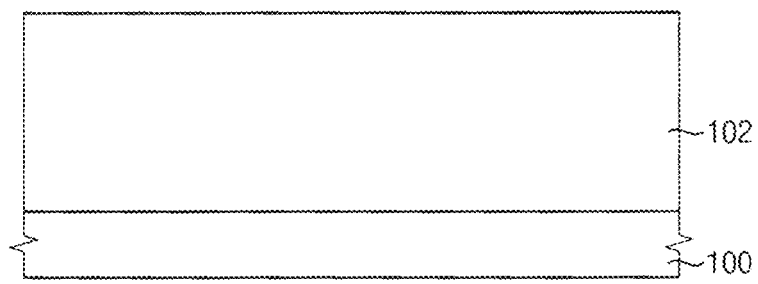
FIG. 5 is a cross-sectional view of a substrate coated with a sample layer of photoresist.
Figure 6:
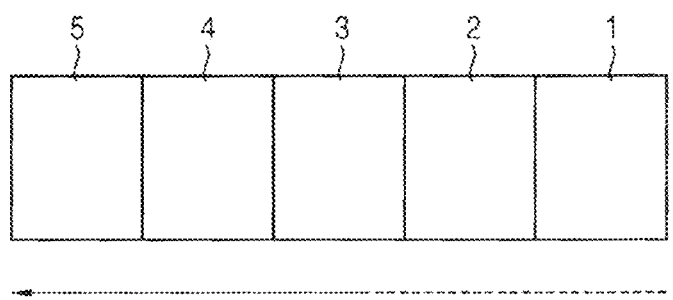
FIG. 6 is a plan view of some shots on the substrate coated with the sample layer of photoresist.
Figure 7:
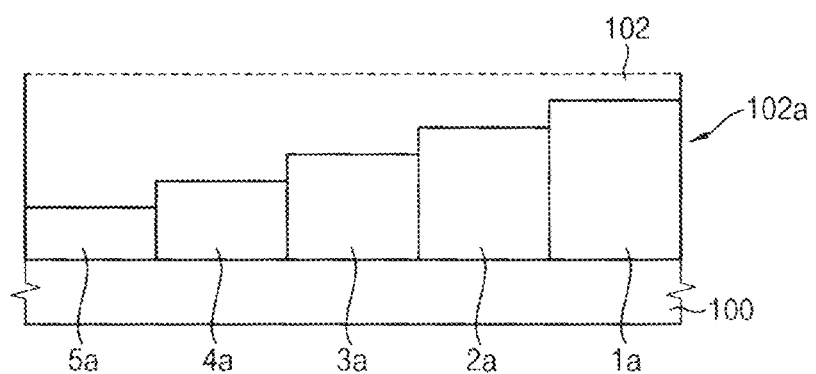
FIG. 7 is a cross-sectional view of the shots after the sample photoresist layer has been exposed and developed.

A technique based on the above of obtaining a relationship between color characteristics of a developed photoresist layer and the intensity of the light used to expose the layer, for use in a photolithography process according to the inventive concept, will now be described in detail beginning with reference to the flowchart of FIG. 4, the schematic diagram of FIG. 5 of a sample layer of photoresist on a substrate, the diagram of FIG. 6 showing the substrate divided into shots, and the diagram of FIG. 7 showing the sample photoresist layer remaining on the shots after the developing process.

Figure 4:
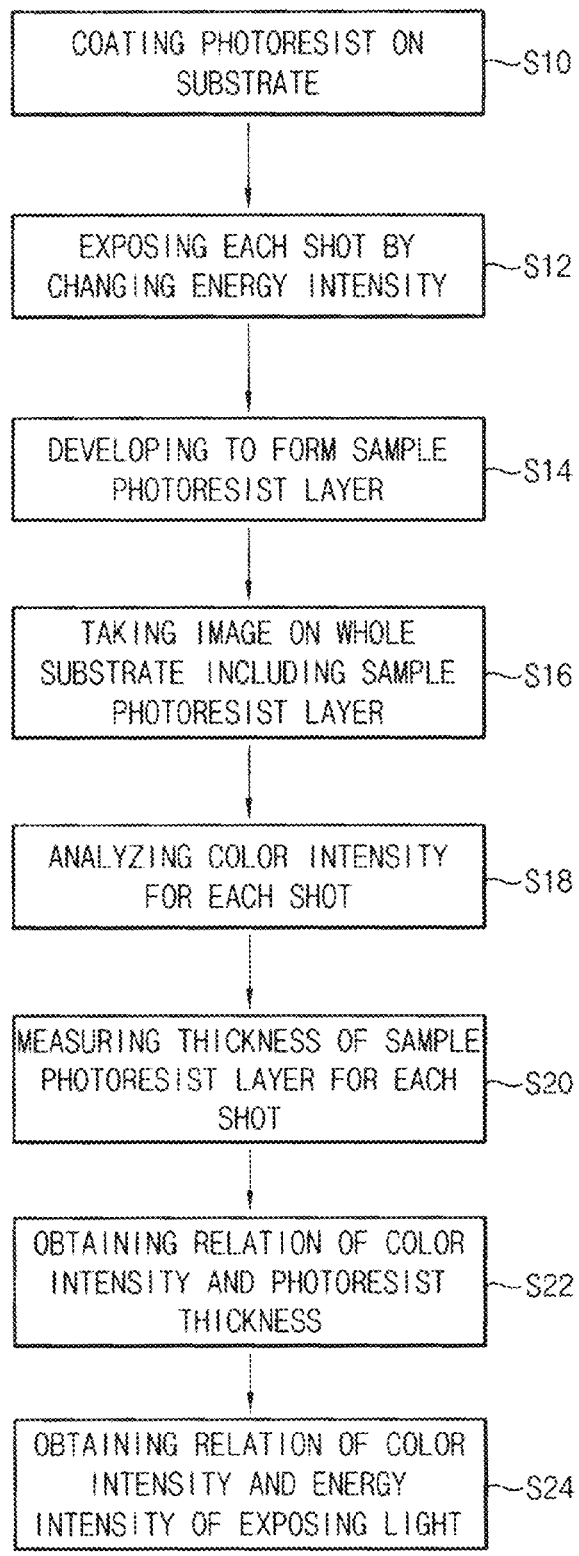
FIG. 4 is a flow chart of a technique of determining a relationship between a color image of a substrate on which a photoresist layer has been exposed and developed and the intensity of the exposure light used to expose the photoresist layer, using measurements of the thickness of the photoresist layer.

Referring to FIGS. 4 and 5, a sample substrate 100 is coated with a uniformly thick layer of photoresist 102 (Step S10).

Referring to FIGS. 4 and 6, the photoresist layer 102 is exposed using a scanner without a reticle in place. In this step, the intensity (energy) of the exposure light is varied among the shots (Step S12).

For example, a first shot 1 is irradiated with exposure light having a first intensity. Then, the second shot 2 is irradiated with the exposure light (light from the same source) but of a second intensity greater than the first intensity by a predetermined amount. The third shot 3, the fourth shot 4 and the fifth shot 5 are sequentially irradiated with the exposure light (light from the same source) of given intensities, respectively, with the intensity of the exposure light used to irradiate each shot 3, 4 and 5 being greater than the intensity of the exposure light used to irradiate the preceding shot by the predetermined amount. The predetermined amount by which the intensity may be increased for each successive shot is preferably in a range of from about 0.05 mJ/cm$^2$ to about 0.2 mJ/cm$^2$.

Referring to FIGS. 4 and 7, the exposed photoresist layer 102 is developed (Step S14). As a result, a sample photoresist layer 102a is formed on the substrate 100. In this example, the sample photoresist layer 102a includes first, second, third, fourth and fifth partial photoresist layers 1a, 2a, 3a, 4a and 5a corresponding to the shots, respectively. As illustrated in FIG. 7, the first partial photoresist layer 1a irradiated by the exposure light having the smallest intensity has the greatest thickness among the partial photoresist layers. Conversely, the fifth partial photoresist layer 5a irradiated by the exposure light having the largest intensity has the smallest thickness among the partial photoresist layers.

An image of the entire substrate, i.e., of the sample photoresist layer 102a formed thereon, is captured by an imaging device such as a CCD camera of a macro investigating system (Step S16).

Figure 8:
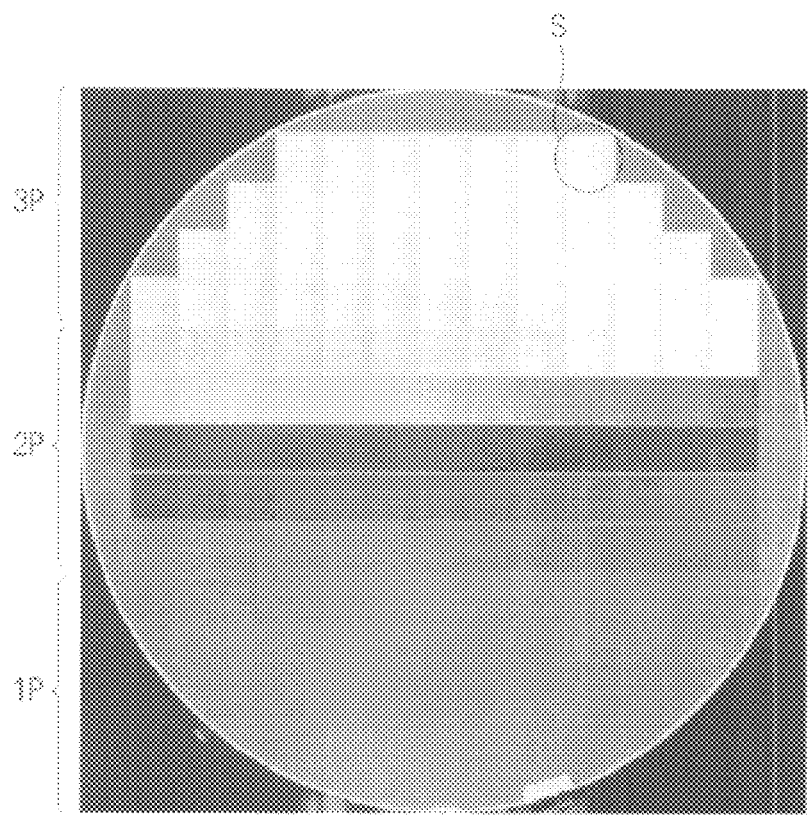
FIG. 8 is a photograph of an actual substrate on which a sample photoresist layer has been exposed and developed according to the technique illustrated in FIGS. 5-7, and shows the relative intensities of the colors of the shots.

FIG. 8 is a photograph of an example of such a captured image. In this example, the process described above with reference to FIGS. 5-7 was initiated in region 3P, progressed over region 2P and then was completed over region 1P. Therefore, the sample shots constituting region 3P were irradiated with the exposure light having the lowest intensities, and the sample shots constituting region 1P were irradiated with the exposure light having the highest intensities.

The sample shots S constituting the first region 1P show little variations in color because the relatively low intensities of the exposure light induced little cross-linking in the sample photoresist layer 102a covering the first region 1P of the substrate. Here, the shots S constituting the first region 1P appeared blue.

The shots S constituting the third region 3P also show little variations in color. However, it can be concluded that in this region that the intensities of the exposure light all exceeded a critical value. In other words, the exposure light induced such a degree of cross-linking in the photoresist layer that almost all portions of the sample photoresist layer 102a in the third region P were removed by the developing process. Here, the shots S constituting the third region 3P appeared to be very bright in color.

On the other hand, in the second region 2P of the substrate, the cross-linking induced in the sample photoresist layer 102a by the exposure light provided the largest differences in thicknesses among the respective shots S, i.e., compared to the first region 1P and the third region 3P. Therefore, the shots S constituting the second region 2P exhibited the largest differences in color gradation.

In the photograph of the sample photoresist layer 102a, each of the shots S is analyzed to determine the intensity of its color selected from the group consisting of red, green and blue (Step S18). More specifically, a color among red, green and blue and exhibited by the shots S is selected for analysis, and the intensity of that color exhibited by each of the shots S is quantified.

In this example, there were large differences in the intensities of the color red exhibited by each of the shots S constituting the second region 2P and so, the intensity of the red exhibited by each of the shots was quantified. However, the color selected for analysis in step S18 is not limited to red, because depending on the type of photoresist, characteristics of the scanner, the thickness of the photoresist layer, etc., the second region 2P may exhibit variations in one of the other colors (blue or green) which are more apparent and hence, easier to quantify. In any case, the values of the intensities of the color selected for analysis (S18) may be graphed (FIG. 9) as correlated with the intensities of the exposure light used to produce the color intensities.

In addition, the thickness of each shot S of the sample photoresist layer 102a is measured (Step S20). In this respect, the thicknesses may be measured using an Ellipsometer. The measured thickness of the photoresist layer for each shot S may be correlated with the intensity of the exposure light used to irradiate the shot, in a graph (FIG. 9).

Figure 9:
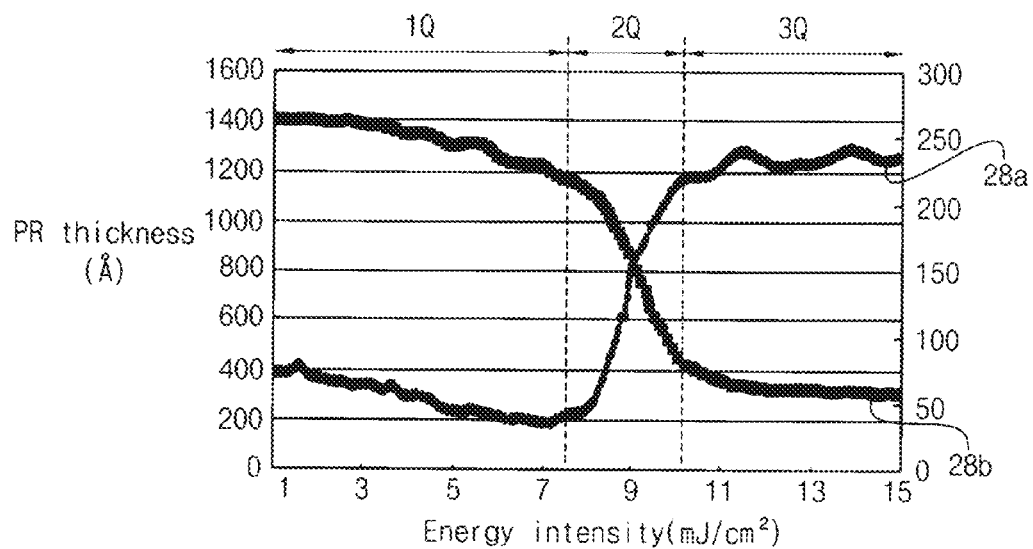
FIG. 9 is a graph of the intensity of the reds for each shot and the thickness of each shot, with respect to the intensity of the exposure light used to irradiate each shot.

In FIG. 9, plot 28a represents a correlation between the intensity of the red of each shot with the intensity of the exposure light used to irradiate the shot (with a relative scale of intensity being provided along the Y-axis on the right hand side of the graph), and plot 28b represents a correlation between the thickness of the sample photoresist layer 102a for each shot with the intensity of the exposure light used to irradiate the shot.

In the first section 1Q of the graph of FIG. 9, the thickness of the sample photoresist layer varies little (is more or less 1,200 angstroms) with changes in the intensity of the exposure light. Likewise, in the third section 3Q, the thickness of the sample photoresist layer varies little (is more or less 250 angstroms) with changes in the intensity of the exposure light. On the other hand, in the second section 2Q, plot 28b shows significant variations (decreases) in the thickness of the sample photoresist layer with changes (increases) in the intensity of the exposure light.

Similarly with respect to the captured image of the photoresist layer 102a, in the first section 1Q, plot 28a shows that the intensity of the red of the image of each shot varies little (from a relatively low value) with changes in the intensity of the exposure light. In the third section 3Q, plot 28a shows that the intensity of the red of the image of each shot varies little (from a relatively high value) with changes in the intensity of the exposure light. On the other hand, in second section 2Q, plot 28a shows that the intensity of the red of the image of each shot varies (increases) significantly with changes (increases) in the intensity of the exposure light.

Next, the correlations described above are used to derive a relationship between the intensity of a color of (red, in this example) and the thickness of a layer of photoresist (Step S22). In this example, the relationship is derived by selecting values of the thicknesses and the color intensities represented by the portion of the plot 28b in the second section 2Q of the graph of FIG. 9, and determining a function of the selected values.

Figure 10:
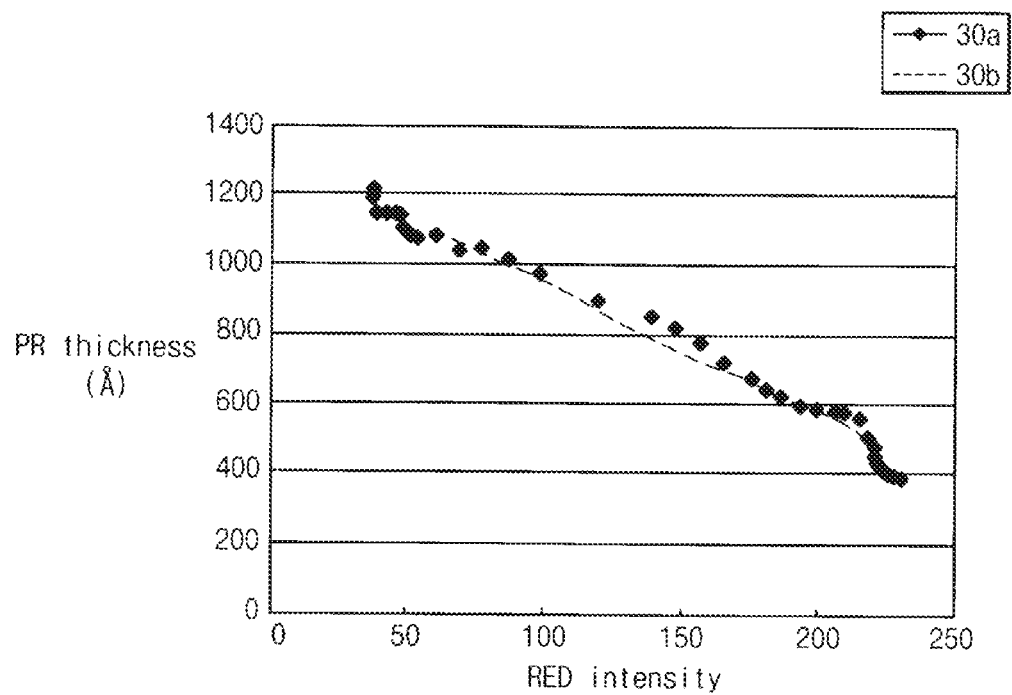
FIG. 10 is a graph illustrating a relationship between the intensity of the red of each shot and the thickness of each shot, as derived from data of plot 28b in the second section of the graph of FIG. 9.

In this example, the relationship between the intensity of the red of a photoresist layer and the thickness of the photoresist layer is basically derived from a function of values selected from the second section 2Q of the graph of FIG. 9 as represented in the graph of FIG. 10. In FIG. 10, plot 30a is a plot of values of intensity versus values of thickness selected from the second section 2Q of the graph of FIG. 9, and plot 30b represents essentially a linear function as a best fit to the plot 30a. That is, in this example, the relationship derived between the intensity of a color of (red, in this example) and the thickness of a layer of photoresist is in the form of a linear function.

Furthermore, the correlations described above are used to derive a relationship between the intensity of a color of (red, in this example) and the intensity of the exposure light (Step S24). In this example, the relationship is derived by selecting values of the thicknesses and the light intensities represented by the portion of the plot 28a in the second section 2Q of the graph of FIG. 9, and determining a function of the selected values.

Figure 11:
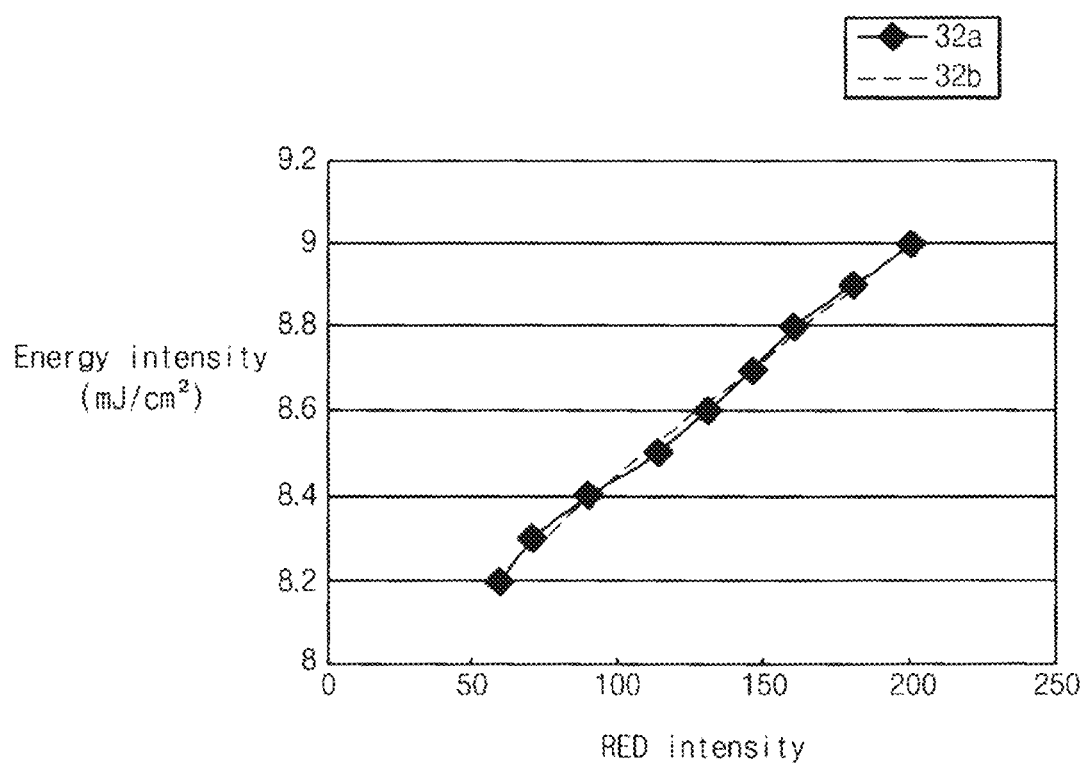
FIG. 11 is a graph illustrating a relationship between the intensity of the red of each shot and the intensity of the exposure light used to irradiate each shot, as derived from data of plot 28a in the second section of the graph of FIG. 9.

In this example, the relationship between the intensity of the red of a photoresist layer and the intensity of the exposure light that resulted in that color intensity is basically derived from a function of values selected from the second section 2Q of the graph of FIG. 9 as represented in the graph of FIG. 11. In the graph of FIG. 11, plot 32a is a plot of values of exposure light intensity versus values of color (red) intensity selected from the second section 2Q of the graph of FIG. 9, and plot 32b represents essentially a linear function as a best fit to the plot 32a. That is, in this example, the relationship derived between the intensity of a color (red, in this example) of a layer of photoresist and the intensity of the exposure light which resulted in that color intensity once the photoresist was developed is in the form of a linear function.

These relationships are then used to determine or "measure" the distribution of the energy of the exposure light passing through the slit of the scanner. Then, this evaluation is used to configure the slit of the scanner so that in an exposure process using a scanner employing the so-configured slit, the energy distribution of the exposure light passing through the slit conforms to a desired distribution, e.g., is uniform as illustrated in FIG. 3B.

Figure 12:
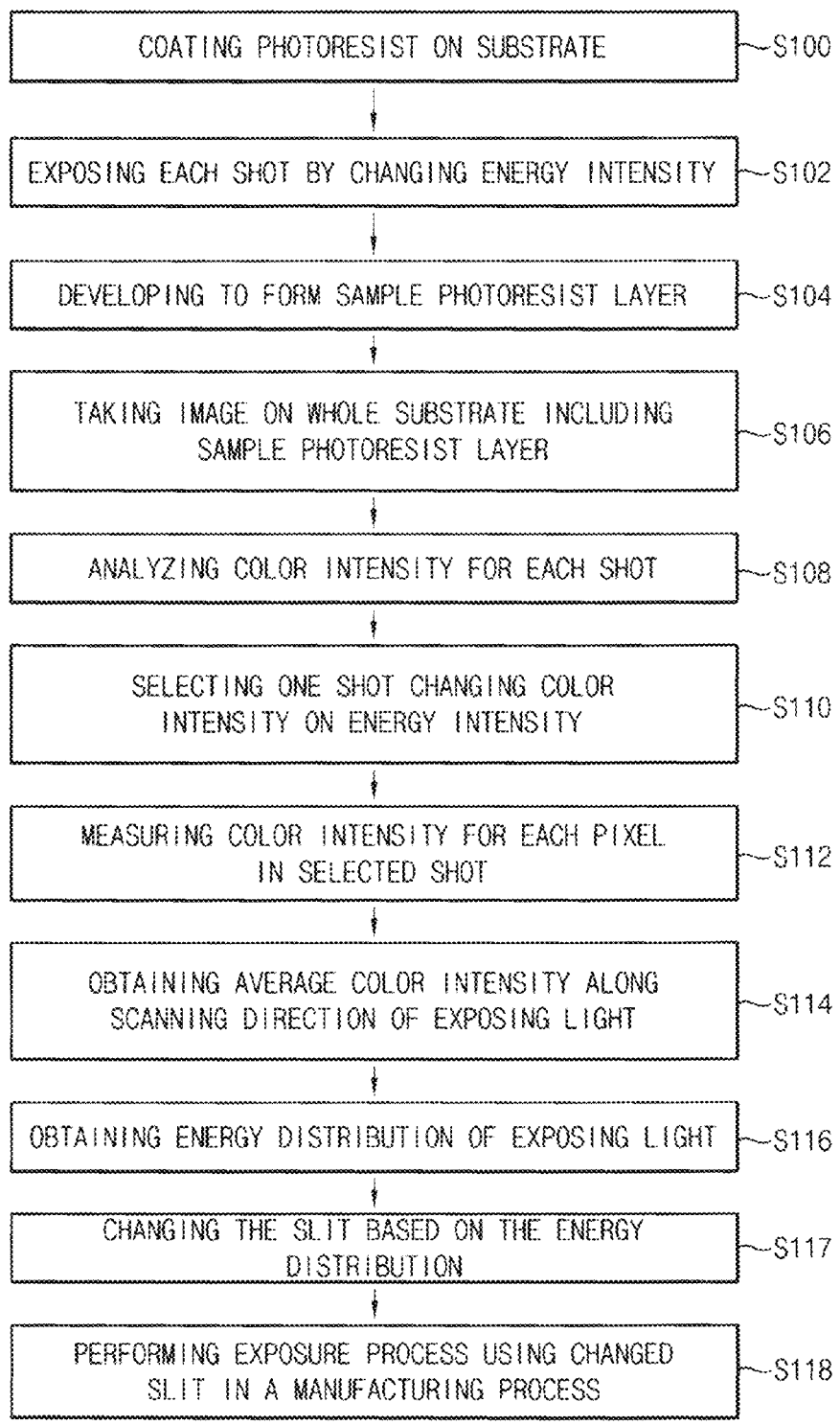
FIG. 12 is a flow chart of a photolithography method according to the inventive concept, including a technique of determining the energy distribution of the exposure light passing through a slit of a scanner used to execute the photolithography.

The technique of determining the energy distribution of exposure light passing through the slit, so that the energy distribution can be evaluated with respect to a desired distribution, will now be described in detail with reference to the flowchart of FIG. 12.

First, a substrate is coated with a layer of photoresist (Step S100).

The photoresist layer is exposed while changing the intensity of the exposure light using a scanner without a reticle in place (Step S102). That is, each shot on the substrate is irradiated with the exposure light of a different intensity. Then the photoresist layer is developed (Step S104). In this respect, the range of the intensities of the exposure light is relatively wide (to produce a wide range of colors once the photoresist layer is developed) and may be based on previously measured and obtained data.

A photograph is then taken of the entire surface of the substrate, on which the sample photoresist layer was formed, using an image device such as a CCD of a macro investigating apparatus (Step S106).

Figure 13:
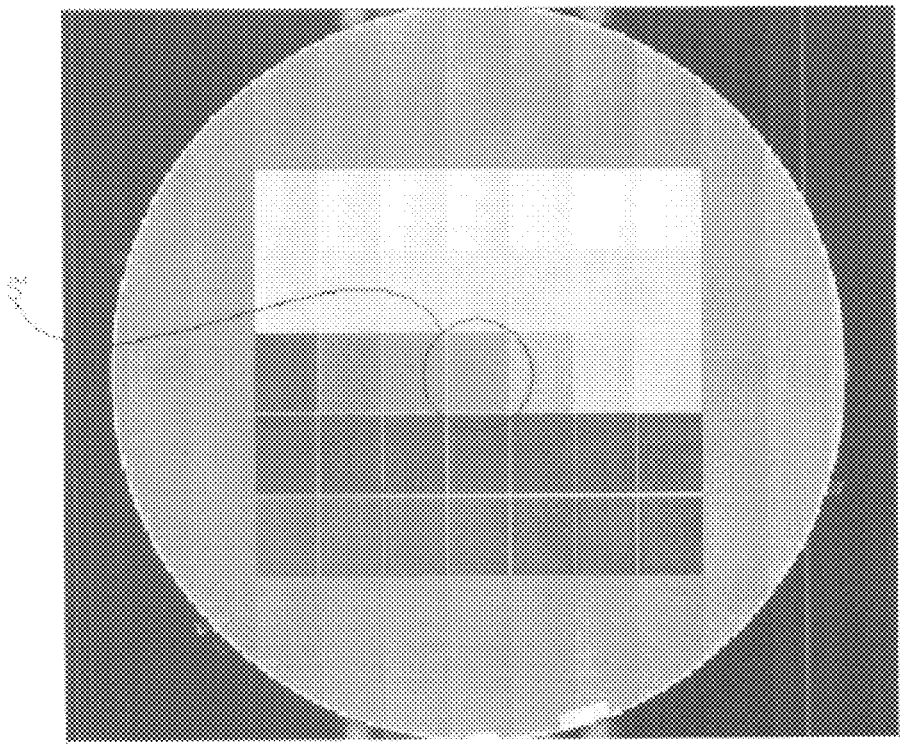
FIG. 13 is a photograph of the entire surface of a substrate produced in a step of the technique of determining the energy distribution of the exposure light according to the inventive concept.

An example of such a photograph is shown in FIG. 13. As can be seen from FIG. 13, the shots exhibit dramatically different colors. Also, in this example, the shots each are about 26 mm×33 mm, the initial exposure energy was about 5.5 mJ/cm$^2$, the intensity of the exposure light energy was increased by about 0.1 mJ/cm$^2$ for each successive shot, and the final exposure energy was about 8.9 mJ/cm$^2$.

Using a photograph of the sample photoresist layer like that shown in FIG. 13, one color from the group consisting of red, green and blue is selected and the intensity of that color of each shot is quantified (Step S108). For example, the intensity of the red of each shot is quantified.

Then a shot whose red is of a relative level of intensity is selected from among the shots also exhibiting that same color (Step S110). In order to determine which shot to select, the intensity of the red of each shot is correlated with the intensity of the exposure light that was used to irradiate the shot. Such a correlation is shown in the graph of FIG. 14.

Figure 14:
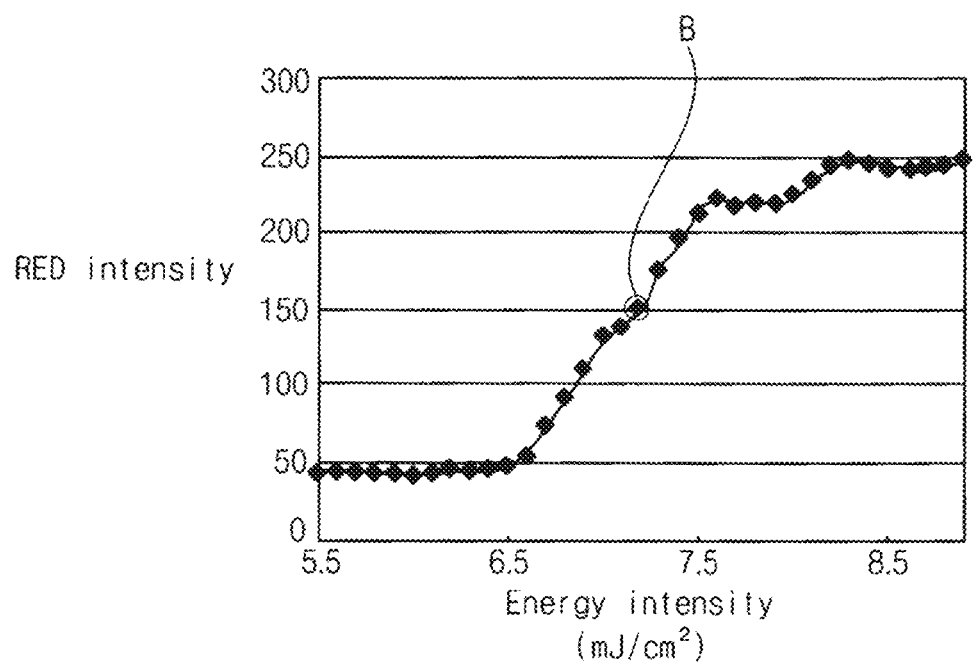
FIG. 14 is a graph of the intensities of the reds of shots with respect to intensity of exposure light that irradiated the shots, as obtained from the technique of determining the energy distribution of the exposure light according to the inventive concept.

Referring to FIG. 14, the shot represented by the middle of a section of the plot having a substantially constant slope of some absolute value greater than 0 is selected. In the example shown by FIG. 13, this shot is that represented by point B. The shot S' selected may simply also be that found at the middle of the substrate.

Next, the energy distribution of the exposure light used to irradiate the selected shot S' is measured (Step S112).

More specifically, pixels of the image of the selected shot S' are analyzed to obtain values for the intensity of the red of the pixels. With respect to the image of the selected shot S', the pixels are located at the intersections of X- and Y-axes, and the X-axis may correspond to the lengthwise direction of the slit through which the exposure light passed when irradiating the shots, and the Y-axis may correspond to the direction along which the exposure field was moved to expose the entire shot.

Figure 15:
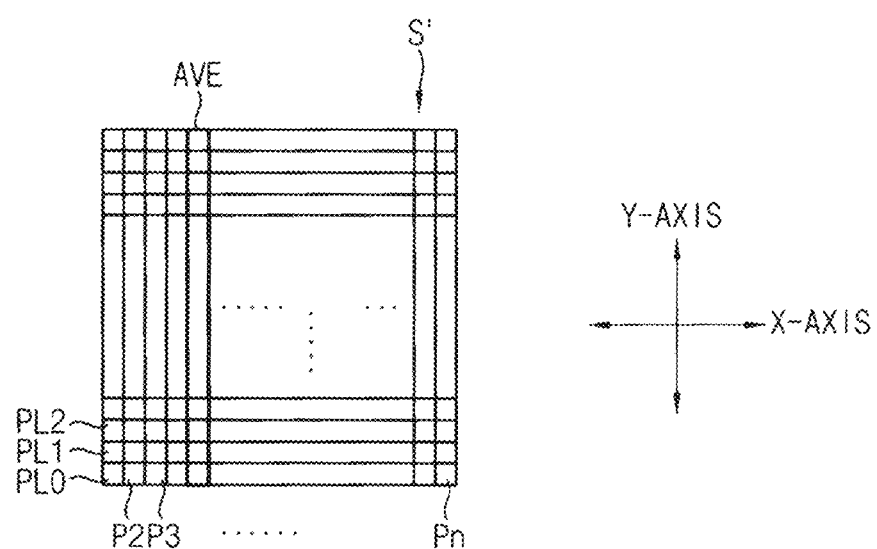
FIG. 15 is a plan view of pixels in a selected one of the shots from the photograph of FIG. 13.

FIG. 15 illustrates the pixels of the selected shot S'. In FIG. 15, PL0, PL1, PL2 . . . are a column of pixels in the direction of the Y-axis, and PL0, P2, P3 . . . Pn are a row of pixels in the direction of the X-axis.

The intensities of the reds of the pixels constituting each column of pixels are averaged (Step S114). In FIG. 15, the characters AVE represent the average value for intensities of the pixels constituting the fifth column from the left. The average values so obtained are assigned to the respective locations of the columns along the X-axis.

Then, the various intensities of the exposure light along the X-axis is determined or "calculated" by applying the relationship derived in step S24 to each intensity value assigned to a location along the X-axis (Step S116). And, these "calculated" intensities of the exposure light along the X-axis are a fairly accurate representation of the energy distribution of the exposure light passing through the slit of the scanner of the exposure apparatus.

Figure 16:
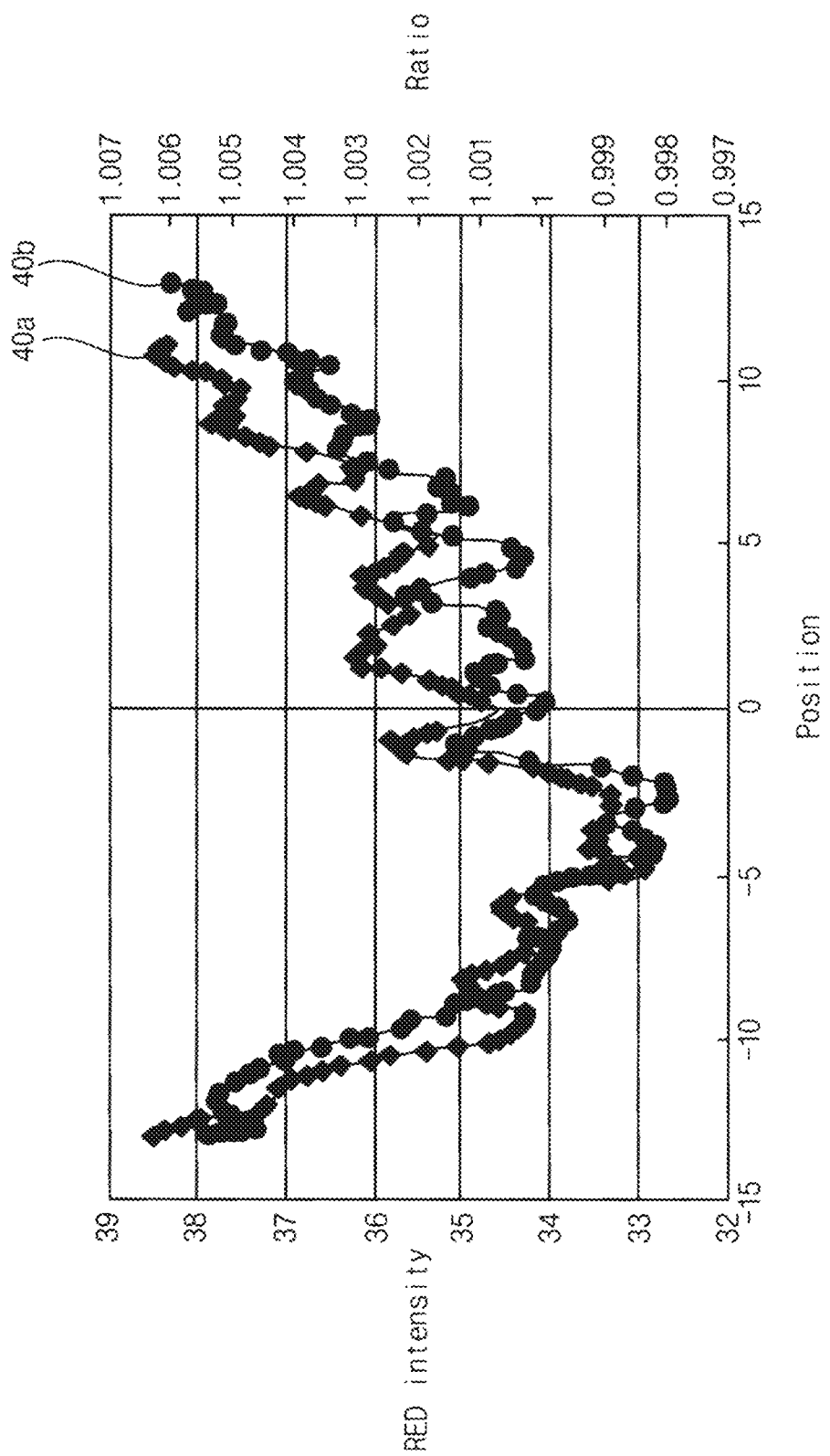
FIG. 16 is a graph illustrating energy distribution of exposure light passing through a slit of an exposure apparatus as determined according to the inventive concept and the energy distribution of the same exposure light as produced using a photosensor of the exposure apparatus.

For purposes of comparison, the energy distribution of exposure light passing through a slit of a scanner of exposure apparatus was determined using the above-described method according to the inventive concept, and the energy distribution of the exposure light passing through the same slit was measured using a sensor in the exposure apparatus. Results from these methods are shown in the graph of FIG. 16. In this graph, plot 40a represents the energy distribution as determined from an image of a selected shot, i.e., as determined according to the inventive concept, and plot 40b represents the energy distribution determined using a sensor in the exposure apparatus.

As can be seen from FIG. 16, the results are similar. Therefore, the inventive concept provides an accurate representation of the energy distribution of the exposure light passing through a slit of a scanner of exposure apparatus.

Next, as mentioned above, the energy distribution obtained in step S116 is used to configure the slit of the exposure apparatus (Step S117) so that the energy distribution becomes more uniform, for example, i.e., has a profile such as that shown in and described with respect to FIG. 3B. Then an exposure process such as that shown and described with reference to FIG. 2 is carried out (Step S118), whereby uniformly exposed shots can be obtained.

As concerns the configuring of the slit, this may include any case of altering the slit used in the exposure step (S12). For instance, the width of certain portions of the slit may be adjusted or the transparency of certain portions of the slit may be adjusted.

More specifically, the slit may include a plurality of parts similar to teeth along the length thereof and each of which is movable in the widthwise direction of the slit. Thus, one or more of the movable teeth may be adjusted to alter the dosage of the exposure light passing through that portion of the slit where the tooth/teeth are located. Alternatively, the scanner may have a module for controlling the distribution of the dosage of exposure light through the slit. The module may include at least two optical systems having different light transmittances. The distribution of the dosage of exposure light through the slit can be adjusted by selecting the appropriate optical system(s) of the module for used during an exposure process. These are just examples and are not exhaustive of the way in which the slit can be configured or reconfigured based on the energy distribution determined according to the inventive concept.

Finally, it should be noted that once the relationship is determined according to an aspect of the inventive concept shown in and described above with reference to FIG. 4, the relationship can be used each time it is required to determine the energy distribution of the light passing through the slit. Furthermore, according to an aspect of the inventive concept, a photoresist coating process, exposure process, imaging process and analyzing process, i.e., steps S100-S114 may be accomplished within a short time of from about a few seconds to about several tens seconds. Accordingly, the energy distribution of the exposure light passing through the slit may be determined, according to an aspect of the inventive concept, within only about five minutes. Thus, the inventive concept may enhance the efficiency of numerous methods of manufacturing a semiconductor device which are known to employ photolithography performed using a scanner-type of exposure apparatus.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A method for use in photolithography performed by an exposure apparatus, the method comprising:
    coating a substrate with a layer of photoresist;

exposing the photoresist layer over each of a plurality of shots sequentially by irradiating the photoresist layer to exposure light of the exposure apparatus, wherein the intensity of the exposure light irradiating each shot is different;

developing the exposed photoresist layer to form a sample photoresist layer;

analyzing an image of the sample photoresist layer to determine the intensity of a color of each shot;

selecting one of the shots from among a group of the shots on the developed sample photoresist layer, wherein the group of shots is a series of sequentially exposed ones of the shots over which the intensity of the colors changes from shot to shot;

determining the intensity of the color of each pixel within an image of the selected shot;

assigning values of the intensity of the color for each pixel to a position of the selected shot;

for each assigned the values of the intensity of the color of the pixels, correlating the color intensity value with a value of the intensity of the exposure light to obtain distribution of energy levels of the exposure light during the process of exposing the layer of photoresist; and changing exposure conditions of the exposure apparatus based on the distribution of energy levels of the exposure light determined from the correlation between the color intensity values and the values of the intensity of the exposure light.

2. The method of claim 1, wherein the analyzing of the image of the sample photoresist layer comprises capturing an image encompassing the entire surface of the substrate.

3. The method of claim 1, wherein the analyzing of the image of the sample photoresist layer comprises selecting one color from the group consisting of red, green and blue, and determining the intensity of the selected color of each shot.

4. The method of claim 3, wherein the color is red.

5. The method of claim 1, wherein the selecting of one of the shots from among a group of the shots comprises selecting a middle one of the shots from said series.

6. The method of claim 1, further comprising deriving a relationship between the intensity of the color of the photoresist and the value of the intensity of the exposure light using another substrate serving as a sample substrate, and wherein said correlating is performed based on said relationship.

7. The method of claim 6, wherein the deriving of said relationship comprises:

coating the sample substrate with a layer of the photoresist, exposing the photoresist layer on the sample substrate over each of a plurality of sample shots sequentially, by irradiating the photoresist layer on the sample substrate to exposure of the exposure apparatus, wherein the intensity of the exposure light irradiating each sample shot is different, developing the exposed photoresist layer on the sample substrate to form a sample substrate photoresist layer, analyzing an image of the developed sample substrate photoresist layer to determine the intensity of a color of each sample shot, and correlating the intensity of the color of selected ones of the sample shots with the intensity of the exposure light that was used to irradiate the selected ones of the sample shots.

8. The method of claim 7, wherein the deriving of said relationship further comprises measuring the thickness of the sample substrate photoresist layer.

9. The method of claim 8, wherein the deriving of said relationship further comprises:

deriving a relationship between the thickness of the sample substrate photoresist layer and the intensity of the color of the sample substrate photoresist layer for each sample shot.

10. The method of claim 1, wherein the exposing of the photoresist layer comprises irradiating each shot with the exposure light, and wherein the intensity of the exposure light is increased by a predetermined amount for each successive one of the shots exposed.

11. The method of claim 10, wherein the predetermined amount is in a range of from about 0.05 mJ/cm$^2$ to about 0.2 mJ/cm$^2$.

12. The method of claim 1, wherein the exposing is performed without using a reticle.

13. The method of claim 1, further comprising irradiating a photoresist layer on a substrate with light directed by using the changed exposure conditions of the exposure apparatus, in a photolithography process as part of a process of manufacturing a semiconductor device.

14. The method of claim 1, wherein changing the exposure conditions of the exposure apparatus is performed so that the exposure light has a uniform distribution of energy levels.

15. A photolithography method of using exposure apparatus, the method comprising:

coating a substrate with a layer of photoresist;

irradiating the photoresist layer to exposure light of the exposure apparatus, wherein the irradiating comprises exposing the photoresist layer over each of a plurality of shots sequentially, the exposure of each of the shots comprises irradiating the shot with the exposure light, and varying the intensity of the exposure light from shot to shot;

developing the exposed photoresist layer to form a sample photoresist layer;

selecting one of the shots on the developed sample photoresist layer;

determining the intensity of a color of each pixel within an image of the selected shot;

based on the determining of the intensity of a color of each pixel, correlating values of intensity of the color with values of the intensity of the exposure light to obtain the distribution of energy levels of the exposure light during the process of irradiating each of the shots with the exposure light; and changing exposure conditions of the exposure apparatus based on the distribution of energy levels of the exposure light determined from the correlation between the color intensity values and the values of the intensity of the exposure light.

16. The method of claim 15, further comprising deriving a relationship between the intensity of the color of the photoresist and the value of the intensity of the exposure light using another substrate serving as a sample substrate, and wherein said correlating is performed based on said relationship.

17. The method of claim 16, wherein the deriving of said relationship comprises:

coating the sample substrate with a layer of the photoresist, exposing the photoresist layer on the sample substrate over each of a plurality of sample shots sequentially, by irradiating the photoresist layer on the sample substrate to exposure light of the exposure apparatus, wherein the intensity of the exposure light irradiating each sample shot is different, developing the exposed photoresist layer on the sample substrate to form a sample substrate photoresist layer, analyzing an image of the developed sample substrate photoresist layer to determine the intensity of a color of each sample shot, and correlating the intensity of the color of selected ones of the sample shots with the intensity of the exposure light that was used to irradiate the selected ones of the sample shots.

18. The method of claim 17, wherein the deriving of said relationship further comprises:

deriving a relationship between the thickness of the sample substrate photoresist layer and the intensity of the color of the sample substrate photoresist layer for each sample shot.

19. The method of claim 14, further comprising irradiating a photoresist layer on a substrate with light directed by using the changed exposure conditions of the exposure apparatus, in a photolithography process as part of a process of manufacturing a semiconductor device.

20. A method for use in photolithography, the method comprising:

coating a sample substrate with a layer of the photoresist;

exposing the photoresist layer on the sample substrate over each of a plurality of sample shots sequentially, by irradiating the photoresist layer on the sample substrate to exposure light of an exposure apparatus, wherein the intensity of the exposure light irradiating each sample shot is different;

developing the exposed photoresist layer on the sample substrate to form a sample substrate photoresist layer;

analyzing an image of the developed sample substrate photoresist layer to determine the intensity of a color of each sample shot;

measuring the thickness of each sample shot; and based on the measured thicknesses of the sample shots, correlating the intensity of the color of the sample shots with the intensity of the exposure light that was used to irradiate the selected ones of the sample shots.

* * * * *